United States Patent
Daikoku et al.

(10) Patent No.: US 9,761,761 B2
(45) Date of Patent: Sep. 12, 2017

(54) LIGHT-EMITTING ELEMENT

(71) Applicant: NICHIA CORPORATION, Anan-shi, Tokushima (JP)

(72) Inventors: Shinichi Daikoku, Tokushima (JP); Shun Kitahama, Tokushima (JP); Keiji Emura, Anan (JP); Akihiro Nakamura, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/041,921

(22) Filed: Feb. 11, 2016

(65) Prior Publication Data

US 2016/0240757 A1   Aug. 18, 2016

(30) Foreign Application Priority Data

Feb. 13, 2015   (JP) .................................. 2015-026130

(51) Int. Cl.
*H01L 33/38* (2010.01)
*H01L 33/42* (2010.01)
*H01L 33/14* (2010.01)

(52) U.S. Cl.
CPC .............. *H01L 33/38* (2013.01); *H01L 33/42* (2013.01); *H01L 33/145* (2013.01)

(58) Field of Classification Search
CPC ....... H01L 33/38; H01L 33/005; H01L 33/60; H01L 33/0079; H01L 33/405; H01L 33/46; H01L 33/56; H01L 33/42; H01L 33/145; H01L 2933/0058; H01L 2933/0025; H01L 2933/0033
See application file for complete search history.

(56) References Cited

U.S. PATENT DOCUMENTS

| | | |
|---|---|---|
| 2008/0048194 A1 | 2/2008 | Kudo et al. |
| 2009/0045426 A1 | 2/2009 | Fehrer et al. |
| 2009/0108250 A1 | 4/2009 | Kim et al. |
| 2009/0179215 A1 | 7/2009 | Matsui et al. |
| 2011/0049472 A1 | 3/2011 | Kim et al. |
| 2012/0033409 A1 | 2/2012 | Jeong et al. |
| 2012/0267672 A1 | 10/2012 | Jeon |
| 2013/0020599 A1 | 1/2013 | Han et al. |
| 2013/0234192 A1 | 9/2013 | Kim et al. |
| 2014/0191277 A1* | 7/2014 | Chen ....................... H01L 33/40 257/99 |
| 2014/0367720 A1 | 12/2014 | Kim et al. |
| 2015/0236210 A1 | 8/2015 | Kim et al. |

(Continued)

FOREIGN PATENT DOCUMENTS

| | | |
|---|---|---|
| JP | H09-129933 A | 5/1997 |
| JP | 2003-069074 A | 3/2003 |

(Continued)

*Primary Examiner* — (Vikki) Hoa B Trinh
(74) *Attorney, Agent, or Firm* — Foley & Lardner LLP

(57) ABSTRACT

A light-emitting element includes a semiconductor stacked body, a light transmissive conductive film disposed on the semiconductor stacked body, the light transmissive conductive film including a plurality of through holes, insulation films disposed in the plurality of through holes, the plurality of through holes being disposed on the semiconductor stacked body; and a pad electrode disposed on the light transmissive conductive film and the insulation films.

16 Claims, 3 Drawing Sheets

(56) References Cited

U.S. PATENT DOCUMENTS

| | | |
|---|---|---|
| 2016/0118564 A1 | 4/2016 | Kim et al. |
| 2016/0233251 A1* | 8/2016 | Sasaki ................ H01L 27/1225 |
| 2017/0047483 A1 | 2/2017 | Kim et al. |

FOREIGN PATENT DOCUMENTS

| | | | |
|---|---|---|---|
| JP | 2003-124517 A | 4/2003 |
| JP | 2005-039264 A | 2/2005 |
| JP | 2006-324296 A | 11/2006 |
| JP | 2007-081368 A | 3/2007 |
| JP | 2008-192690 A | 8/2008 |
| JP | 2009-033157 A | 2/2009 |
| JP | 2009-111342 A | 5/2009 |
| JP | 2009-194367 A | 8/2009 |
| JP | 2010-199395 A | 9/2010 |
| JP | 2011-138820 A | 7/2011 |
| JP | 2012-089846 A | 5/2012 |
| JP | 2014-500624 A | 1/2014 |

* cited by examiner

LIGHT-EMITTING ELEMENT

CROSS-REFERENCE TO RELATED APPLICATION

This application claims priority to Japanese Patent Application No. 2015-026130 filed on Feb. 13, 2015 . The entire disclosure of Japanese Patent Application No. 2015-026130 is hereby incorporated herein by reference.

BACKGROUND

1. Technical Field

The present disclosure relates to a light-emitting element.

2. Description of the Related Art

In light-emitting elements suitable for face-up-type mounting, a light transmissive conductive film such as indium tin oxide (ITO) is formed on approximately an entire surface of a p-type semiconductor layer to diffuse an electric current from a p-side pad electrode to the p-type semiconductor layer. Also, there have been proposed light-emitting elements in which the p-side pad electrode is formed on an insulation film provided on a portion of the light transmissive conductive film, and the p-side pad electrode and the light transmissive conductive film are electrically connected via an opening portion formed in the insulation film, which can improve light extraction efficiency of the light emitting element (see Japanese Unexamined Patent Application Publication No. 2010-199395).

In recent years, further improvement in the light extraction efficiency of light-emitting elements has been required, along with an increase in output of the light-emitting elements. Accordingly, in embodiments of the present invention, it is an object to provide a light-emitting element in which absorption of light emitted from a semiconductor stacked body by an electrode is reduced, and the light extraction efficiency can be further improved.

SUMMARY

The aforementioned object is achieved with the structure described below. That is, a light-emitting element includes a substrate, a semiconductor stacked body disposed on the substrate, a light transmissive conductive film disposed on the semiconductor stacked body and including a plurality of through holes, insulation films disposed in the through holes on the semiconductor stacked body, and a pad electrode disposed on the light transmissive conductive film and on the insulation films With the light-emitting element according to an embodiment of the present invention, the light-emitting element can be provided in which absorption of light emitted from the semiconductor stacked body by a pad electrode can be reduced, and the efficiency of light extraction is improved.

DETAILED DESCRIPTION OF EMBODIMENTS

Figure 1A:
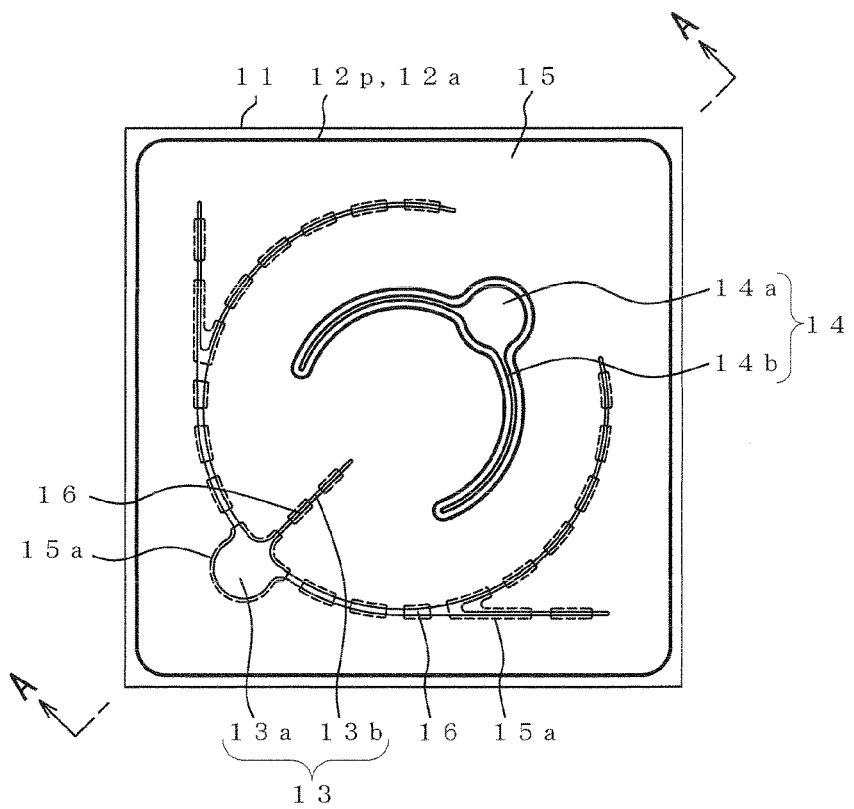
FIGS. 1A and 1B are schematic views of a light-emitting element according to an embodiment, FIG. 1A illustrating a schematic plan view of the light-emitting element, and FIG. 1B illustrating areas where insulation films are arranged.

Hereinafter, a light-emitting element according to embodiments of the present invention will be described. It is noted that the drawings referred in the following descriptions schematically represent embodiments of the present invention. Accordingly, the scales, intervals, and positional relation of respective members may be exaggerated, or the illustration of part of the members may be omitted. Also, the scales or intervals of components may not be the same between a plan view and its corresponding cross-sectional view. Also, in the description below, the same designations or the same reference numerals denote the same or like members, and their detailed descriptions will be appropriately omitted.

In the light-emitting element according to the embodiments of the present invention, the terms "up", "down", "right", and "left" may be replaced in accordance with the circumstances. In the Description, the terms "up" and "down" denote relative locational relationships between the components in the drawings that is referred to for the purpose of explanation, but do not intend to denote an absolute position unless specifically stated otherwise. It is noted that, in FIGS. 2 to 6 used in the following description, a cross-sectional view taken along a line A-A in FIG. 1A is illustrated in an exaggerated way for the sake of convenience, in order to facilitate the understanding of each embodiment of the present invention.

Light-emitting Element 100 According to First Embodiment

Light-Emitting Element 100

Figure 1B:
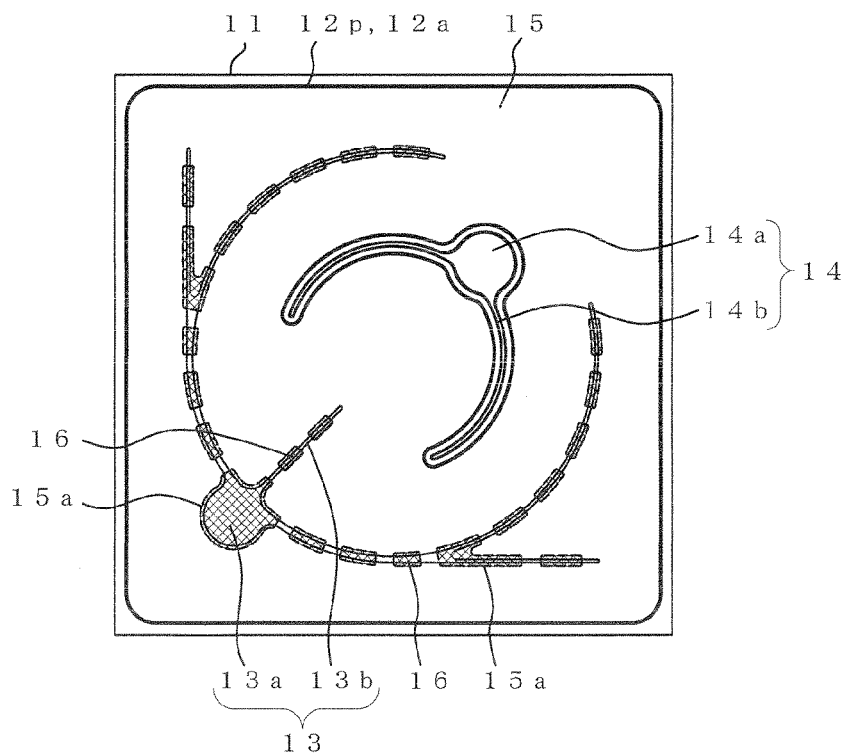
Figure 2:
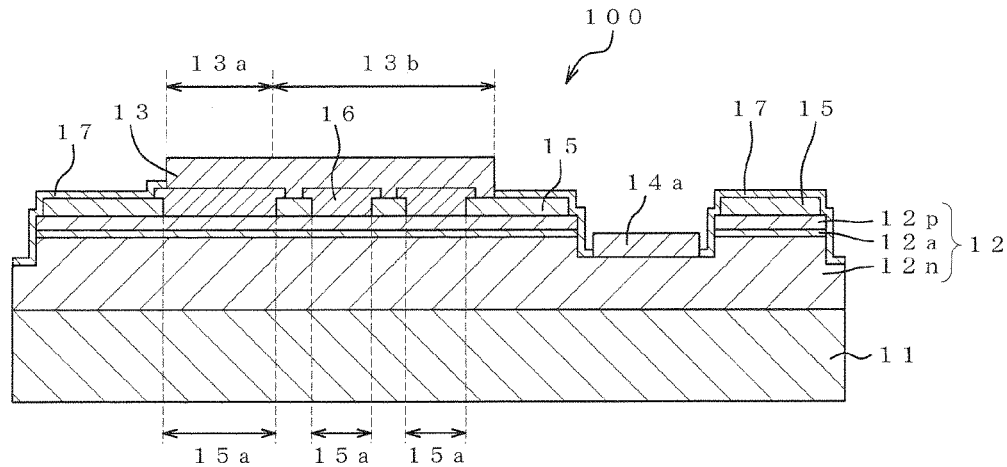
FIG. 2 is a schematic cross-sectional view taken along a line A-A in FIG. 1A, illustrating a layer structure of a light-emitting element 100 according to a first embodiment.

A light-emitting element 100 according to the present embodiment has an approximately square shape as illustrated in FIGS. 1A and 1B in a plan view. As illustrated in FIGS. 1A, 1B, and 2, the light-emitting element 100 includes a substrate 11, a semiconductor stacked body 12 disposed on the substrate 11, a light transmissive conductive film 15 disposed on the semiconductor stacked body 12 and including a plurality of through holes 15a, insulation films 16 disposed in the through holes 15a, pad electrodes 13, 14, at least one of which is disposed on the light transmissive conductive film 15 and on the insulation films 16, and a protective film 17 covering an upper surface of the light-emitting element 100. Also, the light-emitting element 100 according to the present embodiment includes a p-side pad electrode 13 and an n-side pad electrode 14 as the pad electrodes on one surface side of the semiconductor stacked body 12, and thus has a structure suitable for face-up-type mounting. That is, one surface side of the semiconductor stacked body 12, on which the pad electrodes are provided, serves as a surface from which light is mainly extracted. Major components will be described below.

Substrate 11

The substrate 11 is a substrate employed for the epitaxial growth of the semiconductor stacked body 12. In the case where the semiconductor stacked body is formed of a nitride semiconductor such as gallium nitride (GaN), examples of the substrate 11 can include substrates having insulation properties, such as sapphire with a principal plane of C-plane, R-plane, and A-plane and spinel ($MgAl_2O_4$), or silicon carbide (SiC), ZnS, ZnO, Si, GaAs, diamond, and oxide substrates such as lithium niobate and neodymium gallate.

Semiconductor Stacked Body 12

The semiconductor stacked body 12 is disposed on the substrate 11, and includes an n-type semiconductor layer 12n, an active layer 12a, and a p-type semiconductor layer 12p stacked in the this order from the upper surface side of the substrate 11, and configured to emit light when an electric current is conducted between the p-side pad electrode 13 electrically connected to the p-type semiconductor layer 12p and the n-side pad electrode 14 electrically connected to the n-type semiconductor layer 12n. For the n-type semiconductor layer 12n, the active layer 12a, and the p-type semiconductor layer 12p of the semiconductor stacked body 12, $In_xAl_yGa_{1-X-Y}N$ ($0 \leq X$, $0 \leq Y$, $X+Y<1$) can be preferably used. For example, in the case where a phosphor layer is provided to convert a part of a light emitted by the light-emitting element into a light having a different wavelength, the semiconductor stacked body is preferably one that emits blue light or violet light, which has a short emission wavelength. Also, these semiconductor layers may have a single layer structure or may have a stacked structure or super lattice structure with layers having different compositions and thicknesses. In particular, it is preferable that the active layer 12a has a single quantum well structure or multiple quantum well structure made of stacked thin films that can produce quantum effect.

As illustrated in FIG. 2, the semiconductor stacked body 12 includes a region where the p-type semiconductor layer 12p and the active layer 12a are not disposed; that is, the semiconductor stacked body 12 includes a region where the surface of the p-type semiconductor layer 12p has a recess and the n-type semiconductor layer 12n is exposed in the recess. The n-side pad electrode 14 below is electrically connected to this exposed n-type semiconductor layer 12n.

Also, the semiconductor stacked body 12 includes a region where the p-type semiconductor layer 12p and the active layer 12a is not present along a periphery of the semiconductor stacked body 12 to expose the n-type semiconductor layer 12n. This exposed region is disposed on a boundary region (dicing street), which is a region along a boundary line that divides the light-emitting elements in a wafer state into individual light emitting elements.

The region where the n-type semiconductor layer 12n is exposed is covered by the protective film 17 or the n-side pad electrode 14 in the obtained light-emitting element.

Light Transmissive Conductive Film 15

The light transmissive conductive film 15 is disposed so as to cover approximately an entire upper surface of the p-type semiconductor layer 12p and serve as a current diffusion layer for diffusing the electric current supplied from the outside into the entire surface of the p-type semiconductor layer 12p via the p-side pad electrode 13. Because the light from the semiconductor stacked body 12 is extracted to the outside via the light transmissive conductive film 15, it is preferable that the light transmissivity of the light transmissive conductive film 15 be high with respect to the wavelength of the light emitted by the semiconductor stacked body 12.

As illustrated in FIGS. 1A and 1B and FIG. 2, the light transmissive conductive film 15 includes the through holes 15a in approximately an entirety of a region directly below an external connecting portion 13a of the p-side pad electrode and a region directly below and in the vicinity of an extended portion 13b of the p-side pad electrode, which are regions located over the p-type semiconductor layer 12p. In the region directly below the extended portion 13b and the region in the vicinity of the region directly below the extended portion 13b, the plurality of through holes 15a are intermittently disposed along the extended portion 13b of the p-side pad electrode, and the insulation films 16 are disposed in the through holes 15a.

The light transmissive conductive film 15 is formed of a conductive metal oxide. It is preferable that ITO (Sn-doped $In_2O_3$), ZnO, and $In_2O_3$ be employed as the conductive metal oxide. Among them, ITO is a member that has high light transmissivity with respect to visible light and high electric conductivity, so that it is preferable that ITO, which is a suitable member to cover approximately an entire upper surface of the p-type semiconductor layer 12p, be employed.

Herein, in the region directly below the p-side pad electrode 13, the through holes 15a are disposed in the light transmissive conductive film 15, and the insulation films 16 are disposed in the through holes 15a, so that the electric current supplied from the p-side pad electrode 13 flows into the p-type semiconductor layer 12p via the light transmissive conductive film 15. Accordingly, for example, in the region directly below the p-side pad electrode 13, it is preferable that the light transmissive conductive film 15 and the insulation films 16 be alternately arranged to secure the contact areas where the p-side pad electrode 13 and the light transmissive conductive film 15 are in contact, so that an increase of a forward voltage Vf can be reduced.

Insulation Films 16

The insulation films 16, as illustrated with hatching in FIG. 1B, are disposed in the region directly below the p-side pad electrode 13 and the vicinity of the region directly below the p-side pad electrode 13. Also, as illustrated in FIGS. 1A and 1B and FIG. 2, the insulation films 16 are disposed and in the through holes 15a that is on the p-type semiconductor layer 12p intermittently provided in the light transmissive conductive film 15. At this time, the insulation films 16 contact an upper surface of the p-type semiconductor layer 12p, and the light from the semiconductor stacked body 12 is reflected on an interface between the insulation films 16 and the p-type semiconductor layer 12p.

Disposing the insulation films 16 in the through holes 15a of the light transmissive conductive film 15 in the region directly below the p-side pad electrode 13 allows for reducing the electric current flowing through the p-type semiconductor layer 12p in the area directly below the p-side pad electrode 13 and reducing the light emission in the area directly below the p-side pad electrode 13. Accordingly, the amount of light absorbed by the p-side pad electrode 13 can be reduced by reducing the amount of light transmitted to the p-side pad electrode 13, so that the amount of light emitted by the whole of the light-emitting element can be increased.

It is preferable that the insulation films 16 be made of a member having light transmissiveness and having a lower refractive index than that of the light transmissive conductive film 15. The insulation films 16 are disposed in contact with the p-type semiconductor layer 12p, which allows the light transmitted upward in the semiconductor stacked body 12 to be totally reflected based on Snell's law on the interface between the p-type semiconductor layer 12p and the insulation films 16. Accordingly, disposing the insulation films 16 in the area directly below the p-side pad electrode 13 and in the area in the vicinity of the region directly below the p-side pad electrode 13 to efficiently reflect the light advancing to the p-side pad electrode 13 beforehand allows for reducing the amount of light absorption by the p-side pad electrode 13.

The p-side pad electrode 13 may be disposed between the light transmissive conductive film 15 and the insulation films 16, but as illustrated in FIG. 2, it is preferable that the insulation films 16 contact the inner surface of the through hole 15a of the light transmissive conductive film 15. In this structure, in the through hole 15a of the light transmissive conductive film 15, the p-side pad electrode 13 is not disposed between the light transmissive conductive film 15 and the insulation films 16, which allows the light from the semiconductor stacked body 12 not to be directly incident on the p-side pad electrode 13. With this structure, the light absorption by the p-side pad electrode 13 can be reduced, and the light extraction efficiency of the light-emitting element 100 can be further improved.

As illustrated in FIG. 2, it is preferable that a portion of at least one of the insulation films 16 is disposed on an upper surface of the light transmissive conductive film 15. Specifically, it is preferable that at least a portion of a peripheral edge of an opening of the through hole 15a of the light transmissive conductive film 15 be covered. This structure allows for increasing the area on which a light from the semiconductor stacked body 12 is reflected, and allows for further reducing the light absorption by the p-side pad electrode 13, so that the light extraction efficiency of the light-emitting element can be improved. Although the insulation films 16 may cover any appropriate region over the light transmissive conductive film 15, it is preferable that the entire peripheral edge of the opening of the through hole 15a of the light transmissive conductive film 15 be covered for the purpose of increasing the area on which the light from the semiconductor stacked body 12 is reflected.

As the insulation films 16, for example, oxides such as $SiO_2$, $TiO_2$, and $Al_2O_3$, nitrides such as SiN, or fluorides such as $MgF_2$ can be preferably employed. Among them, $SiO_2$, which has a low refractive index, can be more preferably employed.

Also, the insulation films 16 may be a Distributed Bragg Reflector (DBR) film in which two or more kinds of light transmissive dielectric materials having different refractive indices from each other are stacked. As the light transmissive dielectrics to constitute each layer, for example, oxides such as $SiO_2$, $TiO_2$, and $Nb_2O_5$ can be preferably employed. In this manner, the insulation films 16 can be formed as a film having more preferable reflectivity with respect to the light from the semiconductor stacked body 12, so that the light extraction efficiency of the light-emitting element can be further improved.

P-side Pad Electrode 13

The p-side pad electrode 13 is an electrode that serves to supply the electric current from the outside of the light emitting element to the light-emitting element 100, and is disposed on a portion of an upper surface of the light transmissive conductive film 15. The p-side pad electrode 13 is electrically connected to the p-type semiconductor layer 12p via the light transmissive conductive film 15. As illustrated in FIGS. 1A and 1B, the p-side pad electrode 13 includes the external connecting portion 13a, which is a region formed in an approximately circular shape in the plan view and being to be connected to the outside, and the extending portion 13b that extends from the external connecting portion 13a and arranged so as to surround the n-side pad electrode 14 in the plan view.

As illustrated in the plan views of FIGS. 1A and 1B, it is preferable that one of the insulation films 16 disposed in a region directly below the external connecting portion 13a is larger than the region where the external connecting portion 13a of the p-side pad electrode is formed. With this structure, electric current is diffused to the outer side of the external connecting portion 13a of the p-side pad electrode, so that the generation of the light from the semiconductor stacked body 12 directly below the external connecting portion 13a can be reduced. Accordingly, the generation of a light advancing to the external connecting portion 13a of the p-side pad electrode can be reduced, and the light extraction efficiency can be improved. Furthermore, the light advancing to the external connecting portion 13a of the p-side pad electrode can be efficiently reflected by the insulation films 16, so that the light absorption by the external connecting portion 13a of the p-side pad electrode can be reduced.

As illustrated in the plan views of FIGS. 1A and 1B, it is preferable that at least one of the insulation films 16 have a width greater than the width of the extending portion 13b of the p-side pad electrode. With this structure, a similar effect as the aforementioned effect of the insulation films 16 having a larger area than that of the region where the external connecting portion 13a of the p-side pad electrode is formed can be obtained. Herein, the width of the extending portion 13b of the p-side pad electrode means a distance in the direction orthogonal to the direction in which the extending portion 13b extends.

As illustrated in FIGS. 1A and 1B and FIG. 2, the extending portion 13b of the p-side pad electrode is continuously disposed on the upper surface of the light transmissive conductive film 15 and upper surfaces of the insulation films 16 that are alternately arranged, in the area directly below the extending portion 13b of the p-side pad electrode. In FIG. 2, the p-side pad electrode 13 is illustrated with a uniform thickness, but it may have uneven thickness in accordance with a state of the upper surface of the light transmissive conductive film 15 and the upper surfaces of the insulation films 16.

The external connecting portion 13a of the p-side pad electrode can be formed of, for example, Cu, Au, or an alloy whose main component is either of these metals, so as to be suitable for connection to the outside by wire bonding or the like. In the p-side pad electrode 13, the external connecting portion 13a and the extending portion 13b both are made of a same material.

N-side Pad Electrode 14

As illustrated in FIGS. 1A and 1B and FIG. 2, the n-side pad electrode 14 is a pad electrode disposed in the region where the n-type semiconductor layer 12n of the semiconductor stacked body 12 is exposed, and serves to supply the electric current from the outside of the light emitting element to the light-emitting element 100. Accordingly, an external connecting portion 14a of the n-side pad electrode can be formed of, for example, Cu, Au, or an alloy whose main component is either of these metals, so as to be suitable for connection to the outside, by wire bonding or the like. Also, the n-side pad electrode 14 and the n-type semiconductor layer 12n may be electrically connected via a light reflective film made of metal. It is preferable that the light reflective film be constituted of, for example, Al or an alloy whose main component is Al. In the n-side pad electrode 14, the external connecting portion 14a and an extending portion 14b are both made of a same material.

As illustrated in FIGS. 1A and 1B, the n-side pad electrode 14 has an arc shape in the plan view. The n-side pad electrode 14 comprises the external connecting portion 14a formed in a circular shape in the vicinity of an arc-shaped central portion of the n-side pad electrode 14, and the extending portion 14b stretched in an arc from the external connecting portion 14a. The external connecting portion 14a is an area serves to connect to the outside of the light emitting element, and the extending portion 14b serves to efficiently diffuse electric current, which is supplied via the external connecting portion 14a to the n-type semiconductor layer 12n.

Protective Film 17

The protective film 17 is a film that has light transmissiveness and insulation properties, and covers approximately the whole of the upper surface and approximately the whole of a lateral surface of the light-emitting element 100, as illustrated in FIG. 2, except for the lateral surface and a lower surface of the substrate 11. Also, as illustrated in FIG. 2, the protective film 17 includes openings at portions where the p-side pad electrode 13 and the n-side pad electrode 14 are provided. As the protective film 17, for example, $SiO_2$ can be preferably used.

Reflective Film 18

Figure 3:
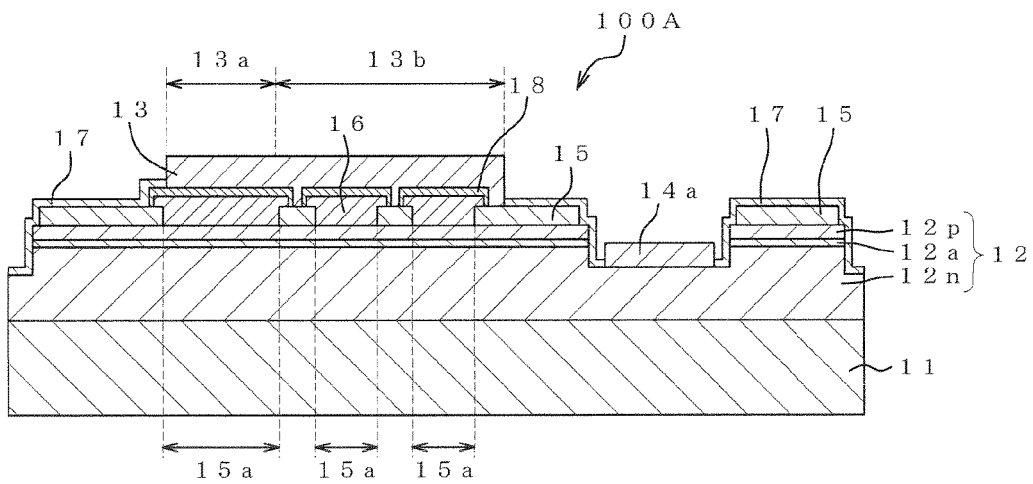
FIG. 3 is a schematic cross-sectional view taken along the line A-A in FIG. 1A, illustrating a layer structure of a light-emitting element 100A according to a variant of the first embodiment.

FIG. 3 illustrates a light-emitting element 100A, which is variant example of the first embodiment. As illustrated in FIG. 3, the light-emitting element 100A is configured such that a reflective film 18 is provided in the configuration of the light-emitting element 100 according to the first embodiment. The reflective film 18 is disposed so as to cover the upper surfaces of the insulation films 16 and the lateral surfaces of the insulation films 16 covering the light transmissive conductive film 15, and the p-side pad electrode 13 is provided on the reflective film 18. In this structure, it is preferable that the reflective film 18 be disposed so as to be in contact with the upper surface of the light transmissive conductive film 15. Accordingly, the region on which the light from the semiconductor stacked body 12 is reflected is increased on the light transmissive conductive film 15, and the light extraction efficiency of the light-emitting element can be further improved. Also, even in the case where a light from the semiconductor stacked body 12 cannot be reflected on the insulation films 16, the light can be reflected on the reflective film 18 that covers the insulation films 16, and thus the light absorption by the p-side pad electrode 13 can be reduced. It is preferable that the reflective film 18 serves to reflect a light from the semiconductor stacked body 12 and is made of, for example, Al or an alloy whose main component is Al.

Light-emitting Element 200 According to Second Embodiment

Light-emitting Element 200

Figure 4:
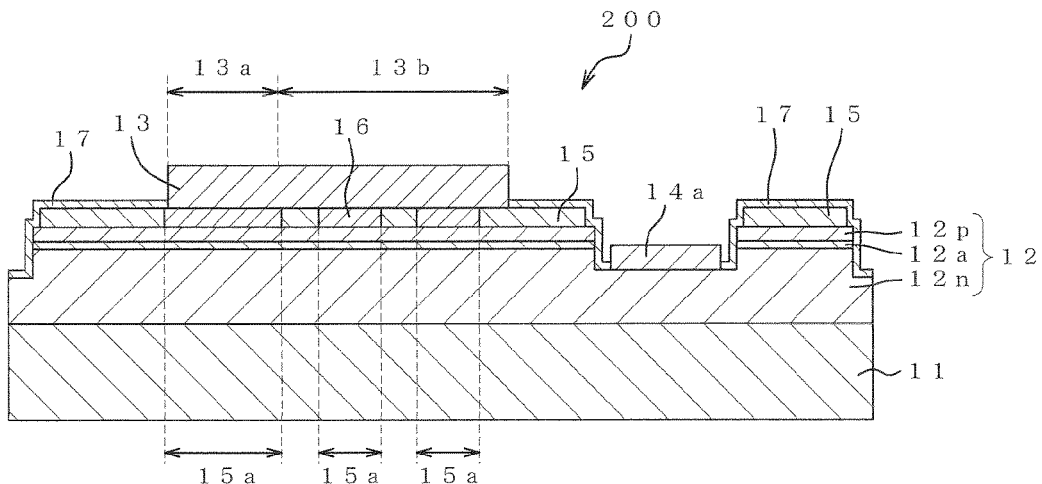
FIG. 4 is a schematic cross-sectional view taken along the line A-A in FIG. 1A, illustrating a layer structure of a light-emitting element 200 according to a second embodiment.

As illustrated in FIG. 4, a light-emitting element 200 according to a second embodiment is different from the light-emitting element 100 according to the first embodiment, in which the insulation films 16 cover a portion of the upper surface of the light transmissive conductive film 15, in that the light transmissive conductive film 15 and the insulation films 16 have approximately the same thickness. With the light-emitting element 200 according to the second embodiment, the light-emitting element having good light extraction efficiency can be obtained, similarly to the light-emitting element 100 according to the first embodiment.

As illustrated in FIG. 4, in the light-emitting element 200, the light transmissive conductive film 15 and the insulation films 16 have approximately the same thickness. With this structure, a contact area between the p-side pad electrode 13 and the light transmissive conductive film 15 can be easily secured, which allows for efficiently reducing increase of the forward voltage Vf. Also, the p-side pad electrode 13 is formed on a surface composed of the upper surface of the light transmissive conductive film 15 and the upper surface of the insulation films 16 that are disposed approximately on the same plane, so that the p-side pad electrode 13 having a uniform thickness can be provided. Herein, if the p-side pad electrode 13 is formed on a surface having a step, the p-side pad electrode 13 may be locally thinned at a portion corresponding to the step, and the thinly-formed portion of the pad electrode may be broken, which may reduce the reliability of the light-emitting element. According to the light-emitting element 200 of the present embodiment, the p-side pad electrode 13 having an approximately uniform thickness can be formed, so that the occurrence of disconnection can be reduced, and a light-emitting element having good reliability can be obtained.

Light-emitting Element 300 According to Third Embodiment

Light-emitting Element 300

Figure 5:
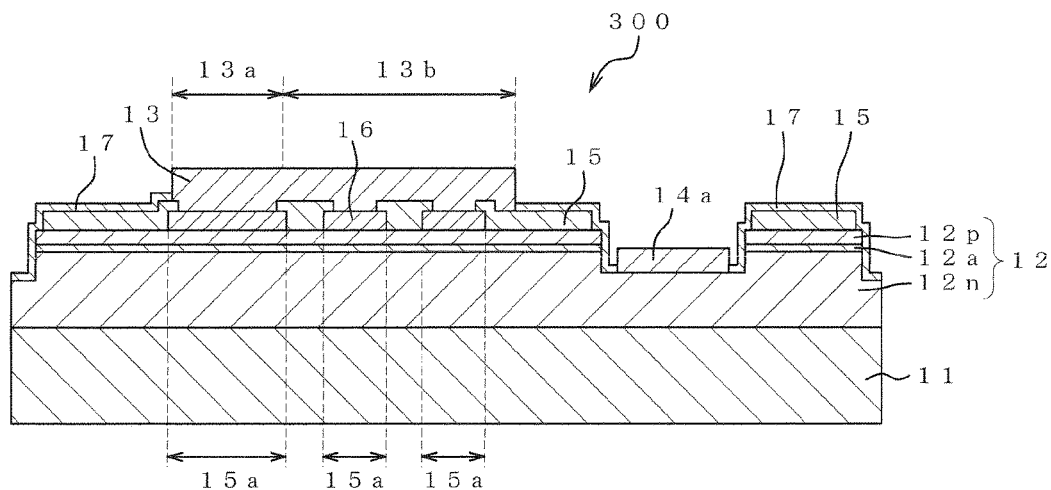
FIG. 5 is a schematic cross-sectional view taken along the line A-A in FIG. 1A, illustrating a layer structure of a light-emitting element 300 according to a third embodiment.

As illustrated in FIG. 5, a light-emitting element 300 according to a third embodiment is different from the light-emitting element 100 according to the first embodiment in which the insulation films 16 cover a portion of the upper surface of the light transmissive conductive film 15, in that the light transmissive conductive film 15 covers at least a portion of the upper surfaces of the insulation films 16. With the light-emitting element 300 according to the third embodiment, the light-emitting element having good light extraction efficiency can be obtained, similarly to the light-emitting element 100 according to the first embodiment.

As illustrated in FIG. 5, in the light-emitting element 300, at least a portion of the light transmissive conductive film 15 is disposed on the upper surface of at least one of the insulation films 16. Specifically, the light transmissive conductive film 15 covers at least a portion of an upper surface of a peripheral region of at least one of the insulation films 16. With this structure, the contact area between the p-side pad electrode 13 and the light transmissive conductive film 15 can be increased, which allows for reducing the forward voltage Vf, compared with an embodiment in which the insulation films 16 of the first embodiment cover at least a portion of the upper surface of the light transmissive conductive film 15. In this case, it is preferable that the p-side pad electrode 13 be disposed in contact with the upper surface and lateral surface of the light transmissive conductive film 15. Although the light transmissive conductive film 15 can cover an appropriate region of at least one of the insulation films 16, but it is preferable that the entire peripheral edges of the insulation films 16 be covered for the purpose of increasing the contact area where the p-side pad electrode 13 and the light transmissive conductive film 15 are in contact.

Figure 6:
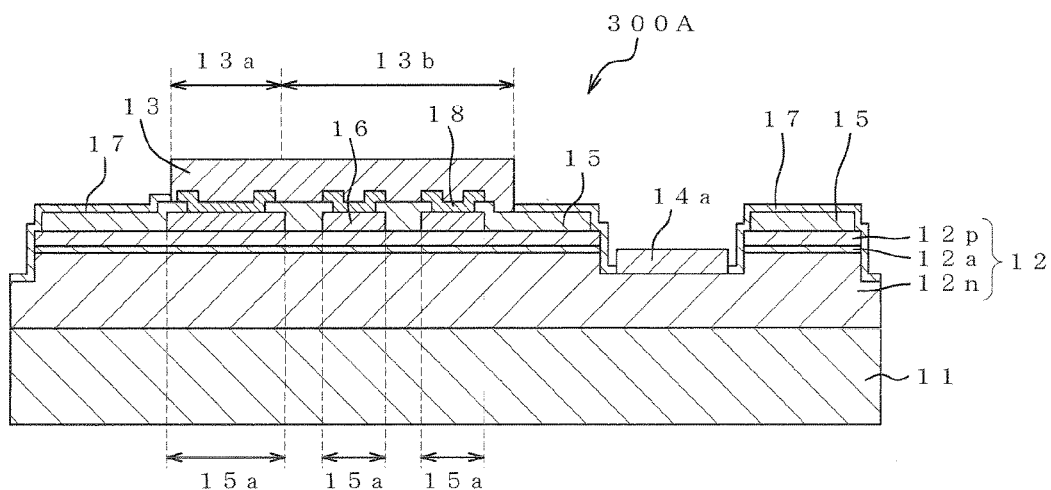
FIG. 6 is a schematic cross-sectional view taken along the line A-A in FIG. 1A, illustrating a layer structure of a light-emitting element 300A according to a variant of the third embodiment.

Also, FIG. 6 illustrates a light-emitting element 300A, which is a variant example of the third embodiment. As illustrated in FIG. 6, the light-emitting element 300A is configured such that the reflective film 18 is provided in the configuration of the light-emitting element 300 according to the third embodiment. The reflective film 18 covers the upper surfaces of the insulation films 16, the upper surface of the light transmissive conductive film 15, and the lateral surface of the light transmissive conductive film 15 that covers the insulation films 16, and the p-side pad electrode 13 disposed on the reflective film 18. With this structure, even in the case where a light from the semiconductor stacked body 12 cannot be reflected on the insulation film 16, the light can be reflected on the reflective film 18, so that light absorption by the p-side pad electrode 13 can be reduced. Furthermore, covering the upper surface of the light transmissive conductive film 15 having light transmissivity allows a light from the semiconductor stacked body 12 that propagates in the light transmissive conductive film 15 and advances to the p-side pad electrode 13 to be reflected by the reflective film 18 disposed so as to cover the upper surface and the lateral surface of the light transmissive conductive film 15. Accordingly, light absorption by the p-side pad electrode 13 can be reduced, and light extraction efficiency of the light emitting element can be improved. Also, the reflective film 18 serves to reflect light from the semiconductor stacked body 12, and it is preferable that the reflective film 18 be formed of, for example, Al or an alloy whose main component is Al.

The embodiments described above are merely described as examples and, the descriptions thereof are not intended to limit the scope of the present invention.

What is claimed is:

1. A light-emitting element comprising:
a semiconductor stacked body;
a light transmissive conductive film disposed on the semiconductor stacked body, the light transmissive conductive film including a plurality of through holes;
a plurality of insulation films disposed in the plurality of through holes on the semiconductor stacked body, the plurality of insulating films including a first insulation film and a second insulation film; and
a pad electrode disposed on the light transmissive conductive film and the insulation films,
wherein the pad electrode includes an external connecting portion for electrically connecting to an outside and an extending portion extending from the external connecting portion,
wherein the first insulation film is disposed in a region directly below the external connecting portion, and the second insulation film is disposed in a region directly below the extending portion, and
wherein, in a plan view, the first insulation film is larger than the external connecting portion.

2. The light-emitting element according to claim 1, wherein at least one of the insulation films is in contact with an inner surface of a corresponding through hole.

3. The light-emitting element according to claim 2, wherein a portion of at least one of the insulation films is disposed on an upper surface of the light transmissive conductive film.

4. The light-emitting element according to claim 2, wherein the light transmissive conductive film and the insulation film have approximately the same thickness.

5. The light-emitting element according to claim 2, wherein at least a portion of the light transmissive conductive film is disposed on upper surfaces of the insulation films.

6. A light-emitting element comprising:
a semiconductor stacked body;
a light transmissive conductive film disposed on the semiconductor stacked body, the light transmissive conductive film including a plurality of through holes;
a plurality of insulation films disposed in the plurality of through holes on the semiconductor stacked body, the plurality of insulating films including a first insulation film and a second insulation film; and
a pad electrode disposed on the light transmissive conductive film and the insulation films,
wherein a portion of at least one of the insulation films is disposed on an upper surface of the light transmissive conductive film,
wherein the pad electrode includes an external connecting portion for electrically connecting to an outside and an extending portion extending from the external connecting portion,
wherein the first insulation film is disposed in a region directly below the external connecting portion, and the second insulation film is disposed in a region directly below the extending portion, and
wherein, in a plan view, the first insulation film is larger than the external connecting portion.

7. A light-emitting element comprising:
a semiconductor stacked body;
a light transmissive conductive film disposed on the semiconductor stacked body, the light transmissive conductive film including a plurality of through holes;
a plurality of insulation films disposed in the plurality of through holes on the semiconductor stacked body, the plurality of insulating films including a first insulation film and a second insulation film; and
a pad electrode disposed on the light transmissive conductive film and the insulation films,
wherein the light transmissive conductive film and the insulation film have approximately the same thickness,
wherein the pad electrode includes an external connecting portion for electrically connecting to an outside and an extending portion extending from the external connecting portion,
wherein the first insulation film is disposed in a region directly below the external connecting portion, and the second insulation film is disposed in a region directly below the extending portion, and
wherein, in a plan view, the first insulation film is larger than the external connecting portion.

8. A light-emitting element comprising:
a semiconductor stacked body;
a light transmissive conductive film disposed on the semiconductor stacked body, the light transmissive conductive film including a plurality of through holes;
a plurality of insulation films disposed in the plurality of through holes on the semiconductor stacked body, the plurality of insulating films including a first insulation film and a second insulation film; and
a pad electrode disposed on the light transmissive conductive film and the insulation films,
wherein at least a portion of the light transmissive conductive film is disposed on upper surfaces of the insulation films,
wherein the pad electrode includes an external connecting portion for electrically connecting to an outside and an extending portion extending from the external connecting portion,
wherein the first insulation film is disposed in a region directly below the external connecting portion, and the second insulation film is disposed in a region directly below the extending portion, and
wherein, in a plan view, the first insulation film is larger than the external connecting portion.

9. The light-emitting element according to claim 1,
wherein a plurality of the through holes of the light transmissive conductive film are disposed in the region directly below the extending portion,
wherein the plurality of insulating films include a plurality of second insulation films disposed in the plurality of through holes that are in the region directly below the extending portion, and wherein the extending portion is continuously disposed on the upper surface of the light transmissive conductive film and the upper surfaces of the second insulation films.

10. The light-emitting element according to claim 6, wherein a plurality of the through holes of the light transmissive conductive film are disposed in the region directly below the extending portion, wherein the plurality of insulating films include a plurality of second insulation films disposed in the plurality of through holes that are in the region directly below the extending portion, and wherein the extending portion is continuously disposed on the upper surface of the light transmissive conductive film and the upper surfaces of the second insulation films.

11. The light-emitting element according to claim 7, wherein a plurality of the through holes of the light transmissive conductive film are disposed in the region directly below the extending portion, wherein the plurality of insulating films include a plurality of second insulation films disposed in the plurality of through holes that are in the region directly below the extending portion, and wherein the extending portion is continuously disposed on the upper surface of the light transmissive conductive film and the upper surfaces of the second insulation films.

12. The light-emitting element according to claim 8, wherein a plurality of the through holes of the light transmissive conductive film are disposed in the region directly below the extending portion, wherein the plurality of insulating films include a plurality of second insulation films disposed in the plurality of through holes that are in the region directly below the extending portion, and wherein the extending portion is continuously disposed on the upper surface of the light transmissive conductive film and the upper surfaces of the second insulation films.

13. The light-emitting element according to claim 1, wherein the insulation films are DBR films.

14. The light-emitting element according to claim 1, wherein a reflective film is disposed on the insulation films.

15. The light-emitting element according to claim 1, wherein the light transmissive conductive film is made of ITO.

16. The light-emitting element according to claim 1, wherein the insulation films are made of SiO2.

* * * * *